(12) United States Patent
Yamakawa et al.

(10) Patent No.: US 8,482,234 B2
(45) Date of Patent: Jul. 9, 2013

(54) MOTOR DRIVE CONTROL DEVICE

(75) Inventors: Toshifumi Yamakawa, Okazaki (JP); Hideto Hanada, Toyota (JP); Kazuhito Hayashi, Inazawa (JP); Masayoshi Suhama, Toyota (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 384 days.

(21) Appl. No.: 12/810,418

(22) PCT Filed: Jan. 23, 2009

(86) PCT No.: PCT/JP2009/051078
§ 371 (c)(1),
(2), (4) Date: Jun. 24, 2010

(87) PCT Pub. No.: WO2009/104452
PCT Pub. Date: Aug. 27, 2009

(65) Prior Publication Data
US 2010/0270955 A1   Oct. 28, 2010

(30) Foreign Application Priority Data
Feb. 19, 2008   (JP) .................................. 2008-037677

(51) Int. Cl.
*H02P 27/00*   (2006.01)
(52) U.S. Cl.
USPC .......................... 318/400.3; 318/434; 318/809
(58) Field of Classification Search
USPC ............... 318/400.3, 434, 809, 799, 802, 772
See application file for complete search history.

(56) References Cited

U.S. PATENT DOCUMENTS

| | | | |
|---|---|---|---|
| 5,694,017 A * | 12/1997 | Lansberry ..................... | 318/809 |
| 7,417,393 B2 | 8/2008 | Okamura et al. | |
| 2006/0119297 A1 | 6/2006 | Okamura et al. | |
| 2009/0121669 A1 | 5/2009 | Hanada | |

FOREIGN PATENT DOCUMENTS

| | | |
|---|---|---|
| JP | A-2000-358393 | 12/2000 |
| JP | A-2004-166415 | 6/2004 |
| JP | A-2005-51894 | 2/2005 |
| JP | A-2007-12568 | 1/2007 |
| JP | A-2007-82375 | 3/2007 |
| JP | A-2007-306658 | 11/2007 |
| WO | WO 2005/013473 A1 | 2/2005 |
| WO | WO 2007/129760 A1 | 11/2007 |

OTHER PUBLICATIONS

Written Opinion of the International Searching Authority dated Mar. 24, 2009 in corresponding International Application No. PCT/JP2009/051078 (with translation).
International Search Report mailed on Mar. 24, 2009 in corresponding International Application No. PCT/JP2009/051078 (with translation).
Notice of Grounds for Rejection mailed on Mar. 24, 2009 in corresponding Japanese Patent Application No. 2008-037677 (with translation).

* cited by examiner

*Primary Examiner* — Karen Masih
(74) *Attorney, Agent, or Firm* — Oliff & Berridge, PLC

(57) ABSTRACT

A motor drive control device includes a battery, a converter, an inverter, and a control section for outputting control signals to the converter and the inverter. The control section has a first map and a second map regarding control of the alternating-current motor and further includes a map switching section for switching from control based on the first map to control based on the second map in accordance with conditions of the battery.

8 Claims, 10 Drawing Sheets

MOTOR DRIVE CONTROL DEVICE

TECHNICAL FIELD

The present invention relates to a motor drive control device, and more particularly to a motor drive control device which converts a variable direct-current voltage to an alternating-current voltage through an inverter, and applies it to an alternating-current motor which is a load.

BACKGROUND ART

To drive an alternating-current motor using a direct-current voltage supplied from a direct-current power supply such as a battery, the following is typically performed: the direct-current voltage is stepped up by a converter serving as a voltage transformer, and then converted to an alternating-current voltage by an inverter before it is applied to the alternating-current motor. Alternating-current motor drive control modes as used in such cases mainly include pulse width modulation (PWM) control and rectangular wave control.

For example, Patent Document 1 discloses driving a motor by switching to the control mode with less loss in an inverter or a motor when it is in a motor operation region in which the motor can be driven either through PWM control or through rectangular wave control.

Patent Document 1: JP 2004-166415 A

DISCLOSURE OF THE INVENTION

Problems to be Solved by the Invention

Typically, rectangular wave control is inferior to PWM control in terms of control responsivity to a required torque, but is more efficient than PWM control in terms of voltage utilization ratio.

However, during rectangular wave control, the ON time (control cycle) of switching elements in an inverter is relatively long, and therefore a larger amount of current is drawn from the battery, and the voltage drop at the battery tends to be significant. This tendency is especially prominent when the battery temperature drops due to external environment, because it causes the battery internal resistance to increase. A drop in battery voltage causes a rectangular wave control region to become larger, which results in a situation in which a deviation of motor output torque with respect to a required torque (hereinafter, referred to as "torque deviation") becomes larger, thus decreasing control responsivity and degrading fuel efficiency. Further, if the battery voltage drops and falls below a lower limit voltage value, damage occurs to the battery and shortens its lifespan.

An object of the present invention is to provide a motor drive control device which allows an improvement in fuel efficiency in terms of electric power while preventing the battery voltage from falling below the lower limit as rectangular wave control is performed.

Means for Solving the Problems

According to one aspect of the present invention, there is provided a motor drive control device comprising a direct-current power supply; a voltage transformer section capable of stepping up a direct-current voltage supplied from the direct-current power supply; an inverter for converting the direct-current voltage supplied from the voltage transformer section to an alternating-current voltage for driving an alternating-current motor; and a control section for outputting control signals to the voltage transformer section and the inverter, wherein the control section has a first map and a second map regarding control of the alternating-current motor, the first map and the second map having an identical relationship between a rotational number of the motor and a motor maximum output torque, wherein the first map is a map in which a step-up starting point of the converter is set in a higher rotational range than that in the second map, and which thus includes a relatively large rectangular wave control region, and the second map is a map for mainly performing pulse width modulation control, and the control section further includes a map switching section for switching from control based on the first map to control based on the second map in accordance with conditions of the direct-current power supply.

By employing the motor drive control device having the above-described structure, motor drive control is performed based on the first map which includes a relatively large rectangular wave control region, which reduces power loss in the inverter and thus improves fuel efficiency, and on the other hand, by switching from control based on the first map to control based on the second map for mainly performing pulse width modulation control in accordance with conditions of the direct-current power supply, the voltage of the direct-current power supply can be prevented from falling below the lower limit.

According to another aspect of the present invention, in the motor drive control device, it is preferable that an entire region in which pulse width modulation control can be performed, ranging from an output voltage of the direct-current power supply to a step-up upper limit voltage of the converter, is set to be a pulse width modulation control region in the second map, whereas the first map includes a rectangular wave control region in which the output voltage of the direct-current power supply is used without being stepped up by the converter to perform rectangular wave control, and a pulse width modulation control region in which pulse width modulation control is performed.

By employing the motor drive control device having the above-described structure, the first map including regions for performing rectangular wave control and pulse width modulation control using the output voltage of the direct-current power supply without stepping it up is adopted as a normal map, which reduces switching loss in the voltage transformer section and allows a further improvement in fuel efficiency, and by switching from control based on the first map to control based on the second map, which almost entirely is a pulse width modulation control region, in accordance with conditions of the direct-current power supply, the voltage of the direct-current power supply can be reliably prevented from falling below the lower limit.

According to still another aspect of the present invention, in the motor drive control device, the map switching section may perform control for switching from the first map to the second map when the output voltage of the direct-current power supply is lower than a predetermined value.

By employing the motor drive control device having the above-described structure, by switching from control based on the first map to control based on the second map when the output voltage of the direct-current power supply becomes lower than a predetermined value, the voltage of the direct-current power supply can be more reliably prevented from falling below the lower limit.

According to still another aspect of the present invention, in the motor drive control device, the map switching section may perform control for switching from the first map to the second map when the output voltage of the direct-current power supply is lower than a predetermined value, and when a modulation ratio, which is a ratio of an amplitude value of a motor input voltage with respect to an output voltage value of the voltage transformer section, is greater than a predetermined value.

By employing the motor drive control device having the above-described structure, control for switching from the first map to the second map is performed when the output voltage of the direct-current power supply is lower than a predetermined value, and when the modulation ratio is greater than a predetermined value, to thereby switch to the pulse width modulation control based on the second map at a time when a transition will soon happen from the pulse width modulation control to the rectangular wave control in the control based on the first map, and thus the step-up performed by the voltage transformer section can be started while the pulse width modulation control continues, and the torque deviation resulting from degradation in the control responsivity can be prevented from occurring.

According to still another aspect of the present invention, in the motor drive control device, it is preferable that the map switching section limits a step-up rate of the voltage transformer section while switching from the first map to the second map when the output voltage of the direct-current power supply is lower than a predetermined value, and when the rectangular wave control based on the first map is being performed.

By employing the motor drive control device having the above-described structure, by limiting the step-up rate of the voltage transformer section before switching from the rectangular wave control based on the first map to the pulse width modulation control based on the second map, the control mode can be switched smoothly and safely, and control failure can be avoided.

According to still another aspect of the present invention, in the motor drive control device, it is preferable that the map switching section performs control for switching from the first map to the second map when the output voltage of the direct-current power supply is lower than a predetermined value, and when the rotational number of the motor is lower than a predetermined value.

By employing the motor drive control device having the above-described structure, it is possible to avoid a situation in which the rectangular wave control, which is relatively unstable control, is performed in a low rotational range of the motor.

According to still another aspect of the present invention, in the motor drive control device, it is preferable that the control section further includes determination means for determining whether the motor is being driven or is in regenerative operation, and the map switching section does not switch from the first map to the second map when the motor is in regenerative operation.

By employing the motor drive control device having the above-described structure, because there is no concern that the voltage may fall below the lower limit since no current is drawn from the direct-current power supply during regenerative operation, the fuel efficiency can be improved by continuing the control based on the first map including a relatively large rectangular wave control region without switching the map.

REFERENCE NUMERALS

10 MOTOR DRIVE CONTROL DEVICE
12 CONVERTER
14, 33 SMOOTHING CAPACITOR
16 INVERTER
20 CONTROL SECTION
22, 26, 37 VOLTAGE SENSOR
23, 28 CURRENT SENSOR
24 TEMPERATURE SENSOR
30 ANGLE-OF-ROTATION SENSOR
32 POWER LINE
34 EARTH LINE
35 CONNECTION LINE
36 POWER LINE
38 U-PHASE ARM
40 V-PHASE ARM
42 W-PHASE ARM
50 PWM CONTROL BLOCK
52 CURRENT COMMAND GENERATION SECTION
54 VOLTAGE COMMAND GENERATION SECTION
56 TWO-PHASE-TO-THREE-PHASE CONVERTER SECTION
58, 80 SWITCHING SIGNAL GENERATION SECTION
60, 72 THREE-PHASE-TO-TWO-PHASE CONVERTER SECTION
62 ROTATIONAL-NUMBER CALCULATION SECTION
70 RECTANGULAR WAVE CONTROL BLOCK
74 TORQUE ESTIMATION SECTION
76 VOLTAGE PHASE CALCULATION SECTION
78 RECTANGULAR WAVE GENERATION SECTION
90 CONTROL MODE SELECTION SECTION
92 CONVERTER CONTROL SECTION
B BATTERY
M ALTERNATING-CURRENT MOTOR
D1 TO D8 DIODE
E1 TO E8 SWITCHING ELEMENT

BEST MODE FOR CARRYING OUT THE INVENTION

Embodiments of a motor drive control device according to the present invention will be described in detail below with reference to the accompanying drawings. In the following description, specific shapes, materials, values, and the like are given by way of example for facilitating the understanding of the present invention, and may be varied as desired according to the application, purpose, specifications, or the like.

Figure 1:
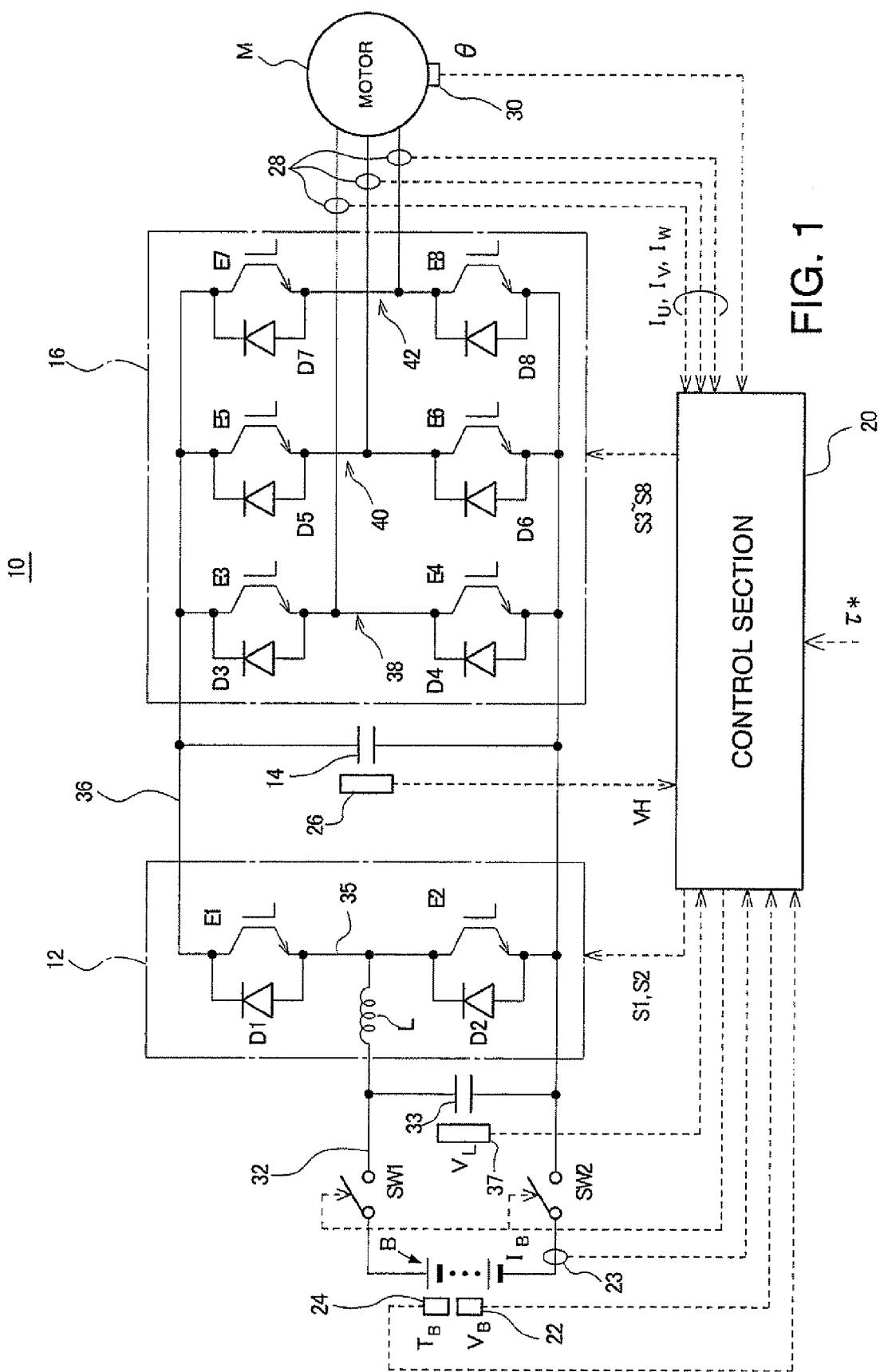
FIG. 1 is an overall schematic block diagram of a motor drive control device according to one embodiment of the present invention.

FIG. 1 is an overall schematic block diagram of a motor drive control device 10 according to one embodiment of the present invention. The motor drive control device 10 includes a battery B serving as a direct-current power supply, system switches SW1 and SW2, a converter 12 serving as a voltage transformer section capable of stepping up a direct-current voltage supplied from the battery B through a smoothing capacitor 33, an inverter 16 for converting the direct-current voltage supplied from the converter 12 through a smoothing capacitor 14 to an alternating-current voltage for use in driving a motor, an alternating-current motor M which is driven by the alternating-current voltage supplied from the inverter 16, and a control section 20 for outputting control signals to the converter 12 and the inverter 16 based on a torque command τ* which is input.

The motor drive control device 10 further includes a voltage sensor 22 and a temperature sensor 24 for detecting an output voltage VB and a temperature TB of the battery B, a current sensor 23 for detecting a battery current IB, a voltage sensor 37 for detecting a voltage applied between terminals of the smoothing capacitor 33, that is, a converter input voltage VL, a voltage sensor 26 for detecting a voltage applied between terminals of the smoothing capacitor 14, that is, a system voltage VH supplied to the inverter, current sensors 28 for detecting currents iu, iv, and iw of the respective phases of the motor respectively flowing from the inverter 16 to U-, V-, and W-phase terminals of the alternating-current motor M, and an angle-of-rotation sensor 30, which may be constituted by, for example, a resolver, a pulse encoder, or the like, for detecting an angle of rotation θ of a rotor of the alternating-current motor M. Detection signals from the sensors 22, 23, 24, 26, 28, 30, and 37 are respectively output to the control section 20.

The alternating-current motor M, which is a three-phase synchronous motor or a three-phase induction motor, is a driving electric motor for generating torque for driving the driving wheels of a vehicle such as a hybrid vehicle or an electric vehicle, and may be configured to function as a generator for outputting electric power during regenerative operation. Further, the alternating-current motor M may be used as a component which can apply power for engine start-up in a hybrid vehicle.

The battery B may be formed of a secondary battery such as a nickel-metal hydride battery or a lithium ion battery. The system switch SW1 is connected between a positive electrode terminal of the battery B and a power line 32, and the system switch SW2 is connected between a negative electrode terminal of the battery B and an earth line 34. The system switches SW1 and SW2 are turned on or off in response to a signal from the control section 20, and turning on the switches SW1 and SW2 causes a direct-current voltage to be supplied from the battery B to the smoothing capacitor 33. The smoothing capacitor 33, which is connected between the power line 32 and the earth line 34, smoothes the direct-current voltage supplied from the battery B and supplies it to the convertor 12.

The converter 12 includes a reactor L, power switching elements (hereinafter, simply referred to as "switching elements") E1 and E2, and diodes D1 and D2. The switching elements E1 and E2 are connected in series between the power line 36 and the earth line 34. As the switching elements E1 and E2, an IGBT (Insulated Gate Bipolar Transistor), a power MOS (Metal Oxide Semiconductor) transistor, a power bipolar transistor, or the like may be used. The diodes D1 and D2 are respectively connected in parallel with the switching elements E1 and E2 such that current flows from the emitter side to the collector side.

The reactor L is connected between a connection line 35 connecting between the switching elements E1 and E2 and the power line 32. Further, the smoothing capacitor 14 is connected between a power line 36 and the earth line 34 connecting between the converter 12 and the inverter 16. The smoothing capacitor 14 supplies to the inverter 16 a system voltage VH which is obtained by smoothing the direct-current voltage supplied from the converter 12.

The inverter 16 includes a U-phase arm 38, a V-phase arm 40, and a W-phase arm 42, which are provided between the power line 36 and the earth line 34 in parallel with each other. Each phase arm 38, 40, or 42 includes two switching elements connected in series between the power line 36 and the earth line 34, and two diodes respectively connected in an inverse parallel relationship with the switching elements. Specifically, the U-phase arm 38 includes switching elements E3 and E4 and diodes D3 and D4, the V-phase arm 40 includes switching elements E5 and E6 and diodes D5 and D6, and the W-phase arm 42 includes switching elements E7 and E8 and diodes D7 and D8. For the switching elements E3 to E8, for example, an IGBT or the like may be used. Whether the switching elements E3 to E8 are turned on or off is controlled based on switching signals S3 to S8 coming from the control section 20.

Intermediate points of the phase arms 38, 40, and 42 are respectively connected to one-sided ends of U-phase, V-phase, and W-phase (hereinafter, simply referred to as "three-phase") coils (not shown) of the alternating-current motor M. The other ends of the three phase coils are connected in common to a neutral point in the motor M.

During step-up operation, the converter 12 steps up the direct-current voltage supplied from the battery B. The stepped-up direct-current voltage is supplied to the inverter 16 as the system voltage VH. More specifically, an ON period of the switching element E1 and an ON period of the switching element E2 are alternately provided in accordance with switching signals S1 and S2 coming from the control section 20, and the step-up ratio corresponds to the ratio of these ON periods.

On the other hand, during step-down operation, the converter 12 steps down the direct-current voltage supplied from the inverter 16 through the smoothing capacitor 14, and the direct-current voltage after being stepped down voltage is charged to the battery B. More specifically, a period during which only the switching element E1 is turned ON and a period during which both the switching elements E1 and E2 are turned OFF are alternately provided in accordance with switching signals S1 and S2 coming from the control section 20, and the step-down ratio corresponds to the duty ratio of the ON periods described above.

When a torque command τ* for the alternating-current motor M is positive (τ*>0), in response to a direct-current voltage supplied from the smoothing capacitor 14, the inverter 16 converts the direct-current voltage to an alternating-current voltage through the on/off operation of the switching elements E3 to E8 performed in accordance with switching signals S3 to S8 coming from the control section 20 to drive the alternating-current motor M so that a positive torque is output. Further, when a torque command τ* for the alternating-current motor M is zero (τ*=0), the inverter 16 converts the direct-current voltage to an alternating-current voltage through the on/off operation of the switching elements E3 to E8 performed in accordance with switching signals S3 to S8 coming from the control section 20 to drive the alternating-current motor M so that the torque becomes zero.

Further, during regenerative operation of a vehicle in which the motor drive control device 10 is mounted, a torque command τ* for the alternating-current motor M is set to be negative (τ*<0). In this case, the inverter 16 converts an alternating-current voltage generated by the alternating-current motor M to a direct-current voltage through the on/off operation of the switching elements E3 to E8 performed in accordance with switching signals S3 to S8, and supplies the direct-current voltage obtained through the conversion to the converter 12 through the smoothing capacitor 14. It should be noted that the term "regenerative operation" as used here does not only refer to operation performed when a vehicle driver operates a brake, but also encompasses operation performed when, for example, release of an accelerator causes the vehicle's acceleration to stop or deceleration to occur.

The current sensors 28 detect three phase currents iu, iv, and iw flowing to the alternating-current motor M, and output them to the control section 20. The angle-of-rotation sensor 30 detects an angle of rotation θ of the rotor of the alternating-current motor M, and outputs it to the control section 20. It should be noted that, instead of using three current sensors 28 to respectively detect currents iu, iv, and iw of the respective phases as described above, because the relationship iu+iv+iw=0 holds, it is possible to detect two phase currents to obtain the remaining one phase current through calculation.

Next, control modes of the alternating-current motor M performed by the control section 20 according to the present embodiment will be described in detail. Typically, three control modes are known as control modes of an alternating-current motor: sinusoidal wave PWM control, overmodulation PWM control, and rectangular wave control.

In the sinusoidal wave PWM control mode, which is used as typical PWM control, the ON/OFF states of the switching elements in the respective phase arms are controlled in accordance with voltage comparison between a sinusoidal voltage command value and a carrier wave (typically, a triangular wave). As a result, the duty ratio is controlled so that a motor input voltage forms a sinusoidal wave in a certain period of time with respect to a set of a HIGH level period corresponding to an ON period of the upper arm elements and a LOW level period corresponding to an ON period of the lower arm elements. In the sinusoidal wave PWM control mode, although smooth rotation is obtained even in a relatively low revolution range, it is well known that the modulation ratio (or the voltage utilization ratio), which is a ratio of an amplitude of a motor input voltage with respect to a system voltage VH which is an inverter input voltage, can only be increased to 0.61 at the maximum.

On the other hand, in the rectangular wave control mode, one pulse of rectangular wave having a HIGH level period and a LOW level period at a ratio of 1 to 1 is applied to an alternating-current motor in the above-described certain period of time. Thus, the modulation ratio can be increased to 0.78, and the output in a relatively high revolution range can be enhanced. Further, because the field-weakening current can be reduced, it is possible to minimize the copper loss in the alternating-current motor M to improve the energy efficiency. Further, because the number of switching performed in the inverter 16 can be reduced, it is also advantageous in that the switching loss can also be reduced.

The overmodulation PWM control mode is a PWM control mode intermediate between the sinusoidal wave PWM control and the rectangular wave control, in which the amplitude of a carrier wave is distorted to be reduced, and a similar PWM control as performed in the above-described sinusoidal wave PWM control mode is performed, so that a motor input voltage distorted in the form of a nearly sinusoidal wave shifted in a voltage increasing direction can be generated, and, as a result, the modulation ratio can be increased to a range of 0.61 to 0.78.

In the alternating-current motor M, an increase in rotational number or output torque causes the induced voltage to increase, and also causes the required voltage to correspondingly increase. The voltage stepped up by the converter, that is, the system voltage VH, must be set to be higher than this required voltage for the motor. On the other hand, there is an upper limit in the voltage value which can be obtained through the step-up performed by the converter 12 (the maximum system voltage value).

Therefore, in a region in which the motor required voltage is lower than the maximum value of the system voltage VH, or is lower than, for example, 650 V, a maximum torque control according to either the sinusoidal wave PWM control mode or the overmodulation PWM control mode is applied, and the output torque is controlled to conform to a torque command τ* by a motor current control according to a vector control.

On the other hand, when the motor required voltage exceeds the maximum system voltage value, while the system voltage VH is held at the maximum value, the rectangular wave control mode according to a field-weakening control is applied. In this case, because the amplitude of the motor input voltage is fixed, the torque control is performed by voltage phase control of rectangular wave pulses based on a deviation between a torque estimation value and a torque command value.

Figure 2:
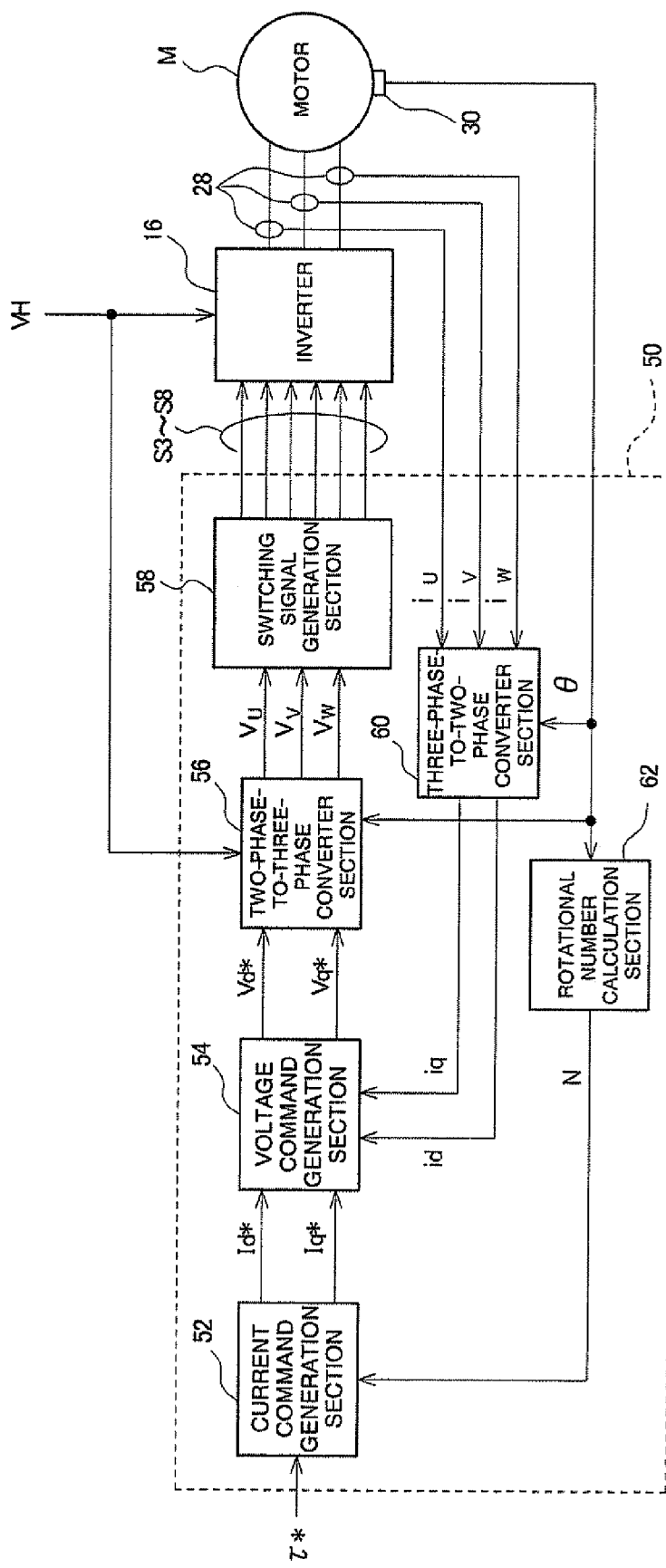
FIG. 2 shows a PWM control block constituting a part of a control section of the motor drive control device.

FIG. 2 shows an example control block for performing maximum torque control in accordance with the sinusoidal wave PWM control and the overmodulation PWM control. The control section 20 has a PWM control block 50. The PWM control block 50 includes a current command generation section 52, a voltage command generation section 54, a two-phase-to-three-phase converter section 56, a switching signal generation section 58, a three-phase-to-two-phase converter section 60, and a rotational-number calculation section 62.

The current command generation section 52, in response to a torque command τ* input to the control section 20 from an electronic control unit (ECU) that is externally provided, calculates a d-axis current command Id* and a q-axis current command Iq* corresponding to the torque command τ* and the rotational number N of the motor from a preset map or table, and outputs them to the voltage command generation section 54. Here, as the rotational number N of the motor, a value calculated by the rotational-number calculation section 62 based on a detection value θ obtained by the angle-of-rotation sensor 30 is used.

The voltage command generation section 54 calculates d-axis and q-axis voltage commands Vd* and Vq* for causing a d-axis actual current id and a q-axis actual current iq to respectively match with the d-axis current command Id* and the q-axis current command Iq* based on a PI operation using the equations shown below (see Eq. 1), and outputs them to the two-phase-to-three-phase converter section 56. Here, as the d-axis actual current id and the q-axis actual current iq, values obtained by converting three phase currents iu, iv, and iw detected by the current sensors 28 based on an angle of rotation θ of the motor in the three-phase-to-two-phase converter section 60 are used.

$$Vd^* = Gpd(Id^* - id) + Gid(Id^* - id)dt$$

$$Vq^* = Gpq(Iq^* - iq) + Giq(Iq^* - iq)dt \quad \text{(Eq. 1)}$$

Here, Gpd and Gpq represent proportional gains for d-axis and q-axis current control, and Gid and Giq represent integral gains for d-axis and q-axis current control.

The two-phase-to-three-phase converter section 56 converts the d-axis voltage command Vd* and the q-axis voltage command Vq* to three phase voltages Vu, Vv, and Vw based on an angle of rotation θ of the alternating-current motor M, and outputs them to the switching signal generation section 58. It should be noted that the conversion from the d-axis voltage command Vd* and the q-axis voltage command Vq* to the three phase voltages Vu, Vv, and Vw also uses the system voltage VH as a factor.

The switching signal generation section 58 generates switching signals S3 to S8 based on comparisons between the three phase voltages Vu, Vv, and Vw and a predetermined carrier wave, and outputs them to the inverter 16. By thus controlling the switching elements E3 to E8 of the inverter 16 to be switched, an alternating-current voltage for outputting a torque according to the torque command τ* is applied to the alternating-current motor M. It should be noted that, as described above, during the overmodulation PWM control, the carrier wave used by the switching signal generation section 58 is switched to that which is distorted such that the amplitude is reduced from a typical one as used during the sinusoidal wave PWM control.

Figure 3:
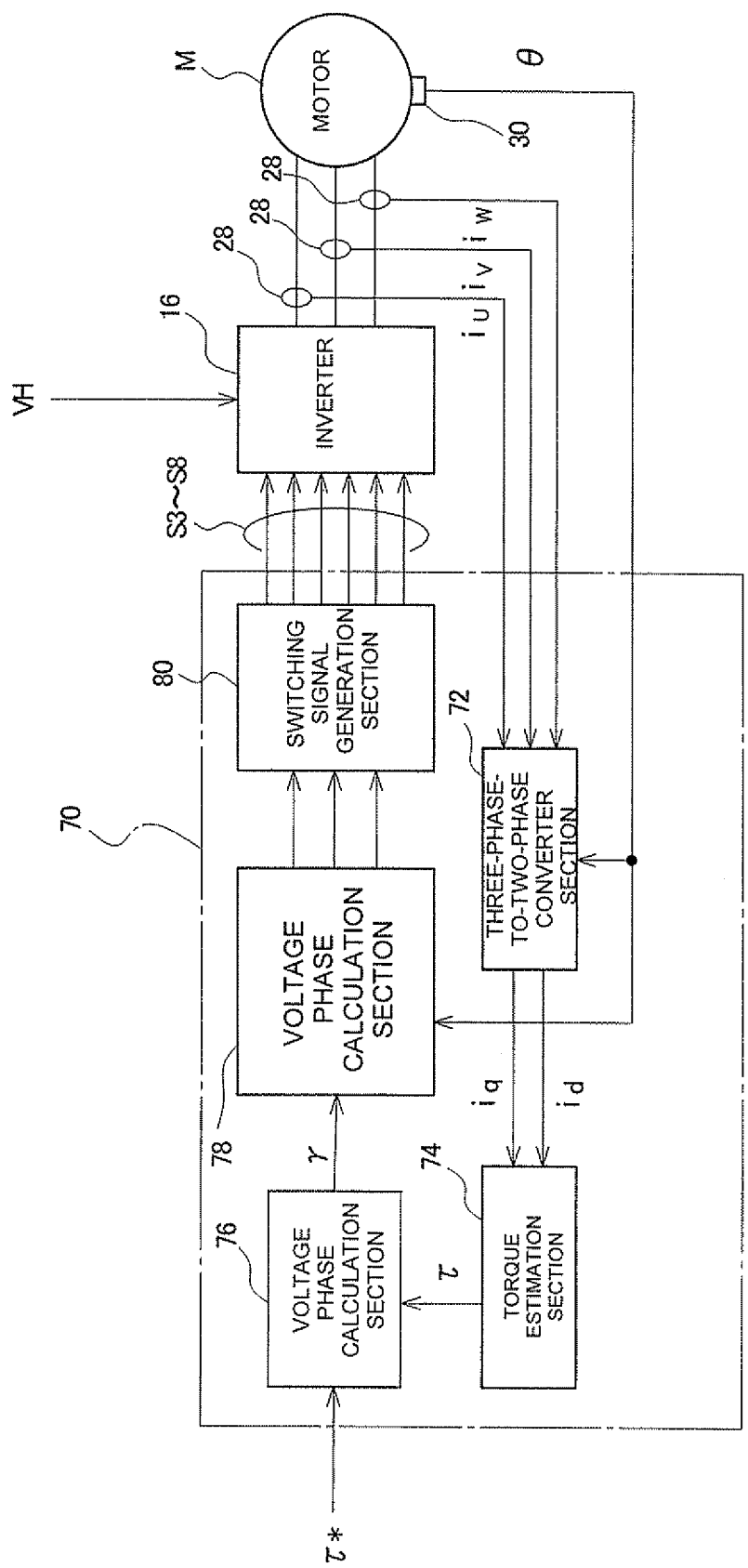
FIG. 3 shows a rectangular wave control block constituting a part of the control section of the motor drive control device.

Next, a rectangular wave control block 70 will be described with reference to FIG. 3. The control section 20 has a rectangular wave control block 70. The rectangular wave control block 70 includes a three-phase-to-two-phase converter section 72, a torque estimation section 74, a voltage phase calculation section 76, a rectangular wave generation section 78, and a switching signal generation section 80.

The three-phase-to-two-phase converter section 72 converts three phase currents iu, iv, and iw detected by the current sensors 28 to a d-axis actual current id and a q-axis actual current iq based on an angle of rotation θ of the motor, and outputs them to the torque estimation section 74. The torque estimation section 74 looks up a torque estimation value τ from a preset map or table based on the d-axis actual current id and the q-axis actual current iq, and outputs it to the voltage phase calculation section 76.

The voltage phase calculation section 76 obtains a control deviation by performing a PI operation using predetermined gains on a torque deviation Δτ which is obtained by subtracting the torque estimation value τ from the torque command τ*, sets a phase γ of a rectangular wave voltage in accordance with the control deviation, and outputs it to the rectangular wave generation section 78. Specifically, when the torque command τ* is positive (τ*>0), the voltage phase is caused to lead under application of an insufficient torque, while the voltage phase is caused to lag under application of an excessive torque, and, when the torque command τ* is negative (τ*<0), the voltage phase is caused to lag under application of an insufficient torque, while the voltage phase is caused to lead under application of an excessive torque.

The rectangular wave generation section 78 generates phase voltage commands Vu, Vv, and Vw (rectangular wave pulses) in accordance with the input voltage phase γ, and outputs them to the switching signal generation section 80.

The switching signal generation section 80 generates switching signals S3 to S8 in accordance with the phase voltage commands Vu, Vv, and Vw, and outputs them to the inverter 16. By thus causing the inverter 16 to perform switching operation according to the switching signals S3 to S8, the rectangular wave pulses according to the voltage phase γ are applied as the phase voltages of the motor. As such, during the rectangular wave control mode, motor torque control can be performed through feedback control of torque.

It should be noted that the switching signal generation section 58 of the PWM control block 50 may also serve as the switching signal generation section 80 of the rectangular wave control block 70.

Figure 4:
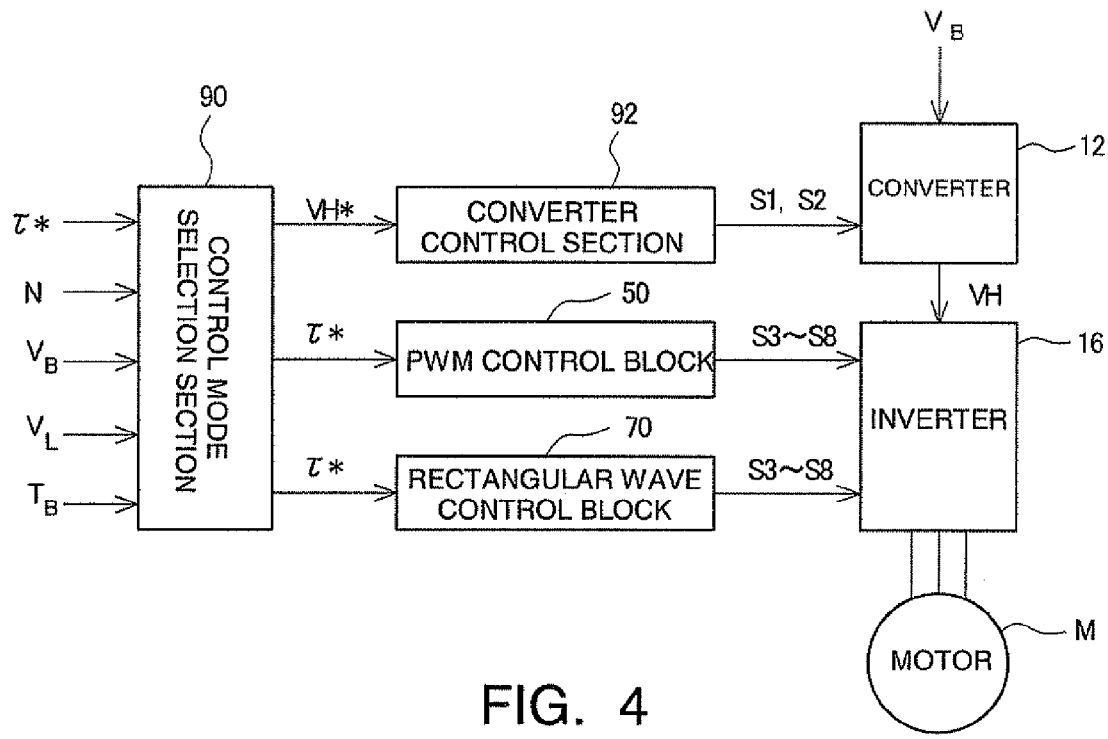
FIG. 4 shows a control mode selection section and a converter control section constituting a part of the control section of the motor drive control device.

The following will describe switching between motor control modes as well as converter control in the motor drive control device 10 according to the present embodiment. As shown in FIG. 4, the control section 20 further includes a control mode selection section (a map switching section) 90 and a converter control section 92. A torque command τ* supplied from the external ECU, a rotational number N of the motor calculated based on a detection value of the angle-of-rotation sensor 30, a battery voltage VB detected by the voltage sensor 22, a converter input voltage VL detected by the voltage sensor 37, and a battery temperature TB detected by the temperature sensor 24 are input to the control mode selection section 90.

Figure 5:
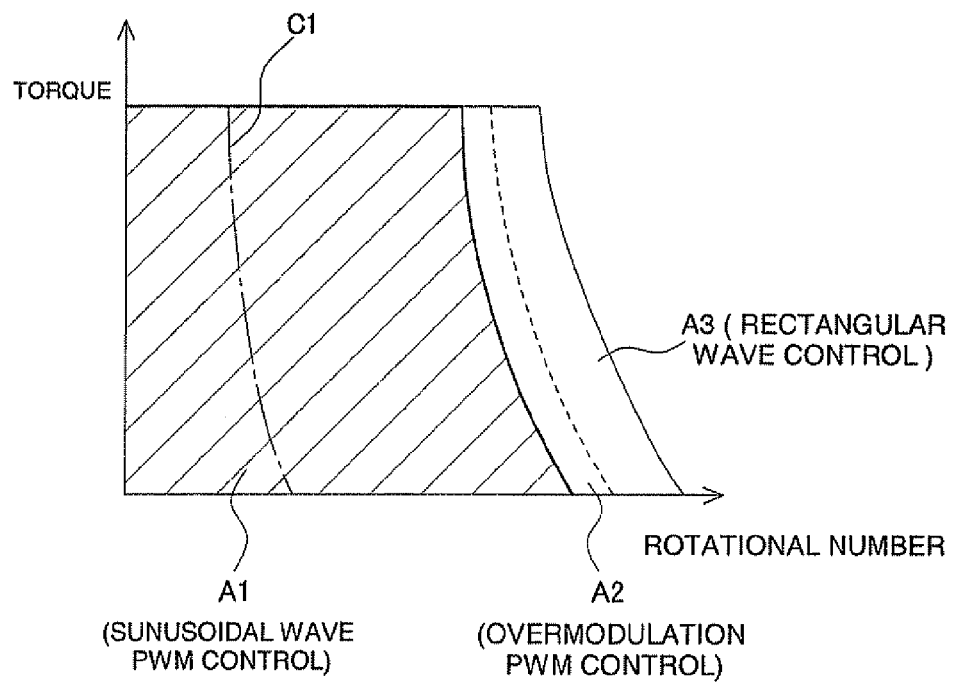
FIG. 5 shows a PWM control map.
Figure 6:
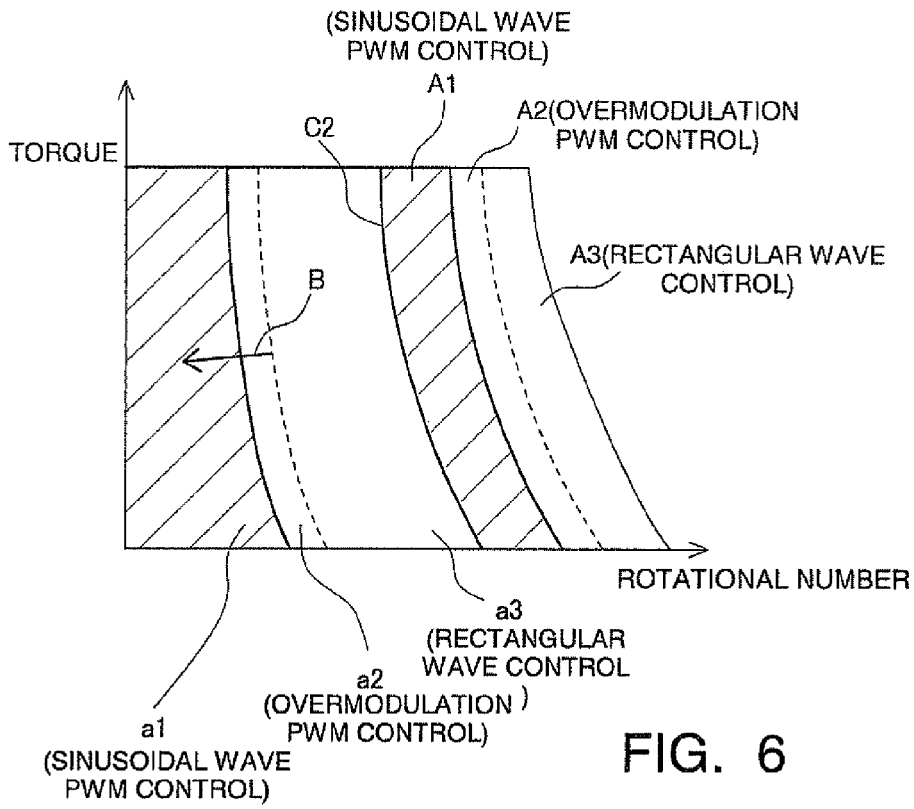
FIG. 6 shows a fuel efficiency improvement map.

The control mode selection section 90 has prestored therein two types of maps defined based on the torque and the rotational number regarding the alternating-current motor M, as shown in FIG. 5 and FIG. 6, and selects a motor control mode by applying one of these maps.

The map shown in FIG. 5 is a PWM control map (a second map) for mainly performing PWM control. The PWM control map is a map for mainly using a sinusoidal wave PWM control region A1 indicated by hatching, in which the system voltage VH (in other words, the step-up ratio achieved by the converter 12) is controlled so that the modulation ratio K in the sinusoidal wave PWM control is maintained constant at the maximum value 0.61. However, because there is an upper limit to the step-up performed by the converter 12, a high revolution region in which the system voltage VH is at the maximum value, and the modulation ratio K is greater than 0.61 and less than 0.78 (0.61<K<0.78), is an overmodulation PWM control region A2, and a further high revolution region in which the system voltage VH is at the maximum value, and the modulation ratio is equal to 0.78 (K=0.78), is a rectangular wave control region A3. It should be noted that in FIG. 5, a line C1 which is described by connecting the starting points of the step-up performed by the converter 12 (hereinafter, referred to as "step-up starting line") is indicated by alternate long and short dashed lines in the sinusoidal wave PWM control region A1.

The map shown in FIG. 6 is a fuel efficiency improvement map (a first map). For the fuel efficiency improvement map, the relationship between the rotational number of the motor and the motor maximum output torque (in other words, the outline of the map) is the same as for the PWM control map, but a step-up starting line C2 of the converter 12 is set in a higher revolution range than the step-up starting line C1 in the PWM control map. Regions on the right side of the step-up starting line C2 are a sinusoidal wave PWM control region A1, an overmodulation PWM control region A2, and a rectangular wave control region A3, as in the above-described PWM control map.

On the other hand, in regions on the left side of the step-up starting line C2, or, in other words, in lower revolution ranges, a sinusoidal wave PWM control region a1, an overmodulation PWM control region a2, and a rectangular wave control region a3 are set in increasing order of the rotational number. Here, the modulation ratio K in the sinusoidal wave PWM control region a1 is less than or equal to 0.61 (K≦0.61), the modulation ratio K in the overmodulation PWM control region a2 is greater than 0.61 and less than 0.78 (0.61<K<0.78), and the modulation ratio K in the rectangular wave control region a3 is equal to 0.78 (K=0.78), which are as in the PWM control map.

In these control regions a1, a2, and a3, the battery voltage VB supplied from the battery B, for example, 200 V, is supplied to the inverter 16 as the system voltage VH without being stepped up by the converter 12. By thus setting the step-up starting line C2 to be in a high revolution range in the fuel efficiency improvement map, the rectangular wave control region in which the battery voltage VB is used without being stepped up is made relatively large. As a result, by performing motor drive control based on this fuel efficiency improvement map during normal operation to make the most of operating points within the above-described relatively large rectangular wave control region, the switching loss in the converter 12 and the inverter 16 is reduced, and thus the fuel efficiency is improved.

The control mode selection section 90 normally selects the fuel efficiency improvement map shown in FIG. 6, and determines in which of the regions a1 to a3 and A1 to A3 an operating point required of the vehicle by the driver lies, based on the torque command τ* and the rotational number N of the motor. Then, when it is determined that the required operating point lies in the region a1, a2, A1, or A2, the torque command τ* is output to the PWM control block 50, and, on the other hand, when it is determined that the required operating point lies in the region a3 or A3, the torque command τ* is output to the rectangular wave control block 70. Further, when it is determined that the required operating point lies in the region a1, a2, or a3 in this determination, the step-up operation performed by the converter 12 is stopped. In this case, the battery voltage VB is supplied to the inverter 16 as the system voltage VH without being stepped up.

Here, when it is determined that the required operating point lies in the region A1, a voltage command VH* which is calculated by dividing a motor required voltage VM determined based on the torque command τ* and the rotational number N of the motor by the modulation ratio K=0.61, is output to the converter control section 92. In response to this voltage command VH*, the converter control section 92 generates switching signals S1 and S2 for causing the battery voltage VB to step up to VH*, and outputs them to the converter 12. Thus, the system voltage VH required for performing sinusoidal wave PWM control in accordance with the torque command τ* in the region A1 is supplied from the converter 12 to the inverter 16.

Further, when it is determined that the required operating point lies in the region A2 or A3, a voltage command VH* for 650 V which is a step-up upper limit value of the converter 12 is output to the converter control section 92. In response to this voltage command VH*, the converter control section 92 generates switching signals S1 and S2 for causing the battery voltage VB to step up to 650 V, and outputs them to the converter 12. In response, the converter 12 operates so that the battery voltage VB is stepped up to 650 V, and is supplied through the smoothing capacitor 14 to the inverter 16. Therefore, the overmodulation PWM control is performed in the region A2 using the system voltage VH of 650 V, and the rectangular wave control is performed in the region A3 using the system voltage VH of 650 V.

In the region a3 of the above-described fuel efficiency improvement map shown in FIG. 6, because the battery voltage VB is supplied as the system voltage VH without being stepped up by the converter 12 to perform the rectangular wave control, the location and the size of the rectangular wave control region a3 in the fuel efficiency improvement map largely depend on the battery voltage VB. In particular, when the battery temperature drops due to external environment, an increase in internal resistance causes the voltage drop to increase, and lowers the battery voltage VB. As a result, as indicated by an arrow B in FIG. 6, the rectangular wave control region a3 will be shifted or expanded toward the left, or, in other words, to the lower revolution range side, resulting in a situation in which the torque deviation increases, the control responsivity degrades, and the fuel efficiency declines somewhat. Further, if the battery voltage drops and falls below the lower limit, it also damages the battery itself and shortens its lifespan. With this being the situation, in order to avoid such drawbacks, the control mode selection section 90 in the motor drive control device 10 according to the present embodiment controls switching of maps from the fuel efficiency improvement map to the PWM control map in accordance with the battery conditions, as will be described below.

FIGS. 7 to 12 are flowcharts each showing the control of switching from the fuel efficiency improvement map to the PWM control map. The control flow processes as shown can be performed at predetermined intervals while the fuel efficiency improvement map is being applied. Alternatively, the processes may also be performed at predetermined intervals when a temperature sensor mounted on the vehicle detects that the ambient temperature outside the vehicle has reached a predetermined temperature (for example, 0° C.) or below. Further, although the battery voltage VB detected by the voltage sensor 22 is used as a parameter for determination in each of the control flows described below, whether or not to switch the map may instead be determined based on the battery temperature TB detected by the temperature sensor 24 or a battery voltage estimated from the battery internal resistance. In this case, the map may be switched when the battery temperature TB detected by the temperature sensor 24 drops below, for example, minus 10° C.

Figure 7:
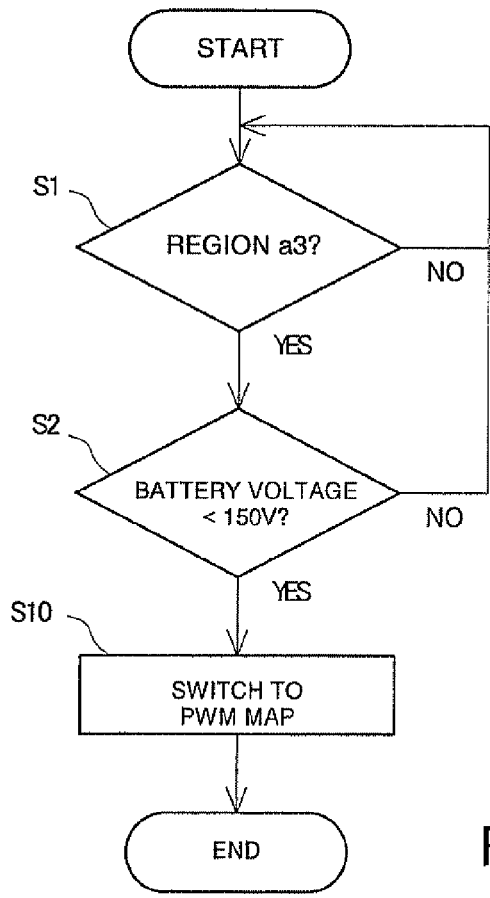
FIG. 7 is a flowchart showing control according to a first embodiment, which is performed in the control mode selection section.

FIG. 7 shows a control flow according to a first embodiment. First, it is determined whether or not the current operating point is located in the region a3 of the fuel efficiency improvement map, or, in other words, whether or not the rectangular wave control is performed using the non-stepped-up voltage, 200 V, for the alternating-current motor M (step S1). When it is determined that the operating point is not located in the region a3 in this determination (NO at step S1), the motor control is continued at the operating point located in the other regions of the fuel efficiency improvement map.

On the other hand, when it is determined that the operating point lies in the region a3 (YES at step S1), it is then determined whether or not the battery voltage VB detected by the voltage sensor 22 is less than 150 V (step S2). When the battery voltage VB is not less than 150 V (NO at step S2), the control based on the fuel efficiency improvement map is continued without switching the map. On the other hand, when the battery voltage VB is less than 150 V (YES at step S2), control for switching the map to be applied from the fuel efficiency improvement map to the PWM control map is performed (step S10). It should be noted that instead of the battery voltage VB as described above, the converter input voltage VL detected by the voltage sensor 37 may be used.

Figure 8:
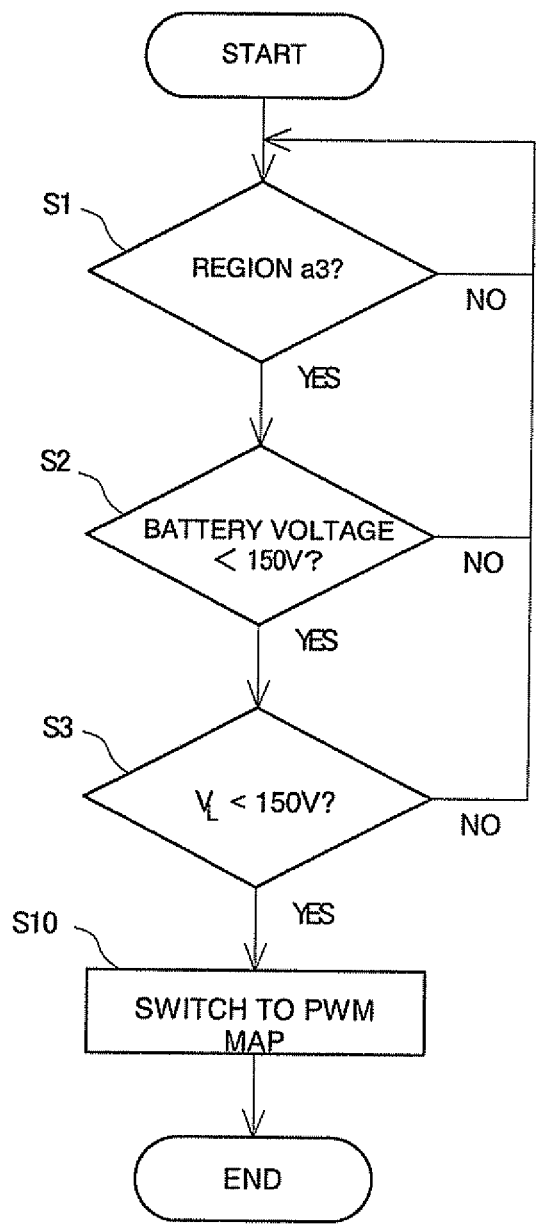
FIG. 8 is a flowchart showing control according to a second embodiment, which is performed in the control mode selection section.

FIG. 8 shows a control flow according to a second embodiment. Steps S1 and S2 in this control flow are the same as those in the control flow according to the first embodiment shown in FIG. 7. When the battery voltage VB drops below 150 V (YES at step S2), it is determined whether or not the converter input voltage VL detected by the voltage sensor 37 is lower than 150 V (step S3). This step is performed in order to more reliably determine the battery conditions by also confirming the converter input voltage VL which is the initial voltage yet to be stepped up. When the converter input voltage VL is equal to or greater than 150 V (NO at step S3), the control based on the fuel efficiency improvement map is continued without switching the map. On the other hand, when the converter input voltage VL is less than 150 V (YES at step S3), control for switching the map to be applied from the fuel efficiency improvement map to the PWM control map is performed (step S10).

As described above, by switching the control mode of the alternating-current motor M from the rectangular wave control based on the fuel efficiency improvement map to the sinusoidal wave PWM control based on the PWM control map in accordance with the battery conditions, such as the output voltage, temperature, and internal resistance of the battery, the voltage of the battery B can be prevented from falling below the lower limit, the control responsivity can be improved, and degradation in fuel efficiency can be prevented.

Figure 9:
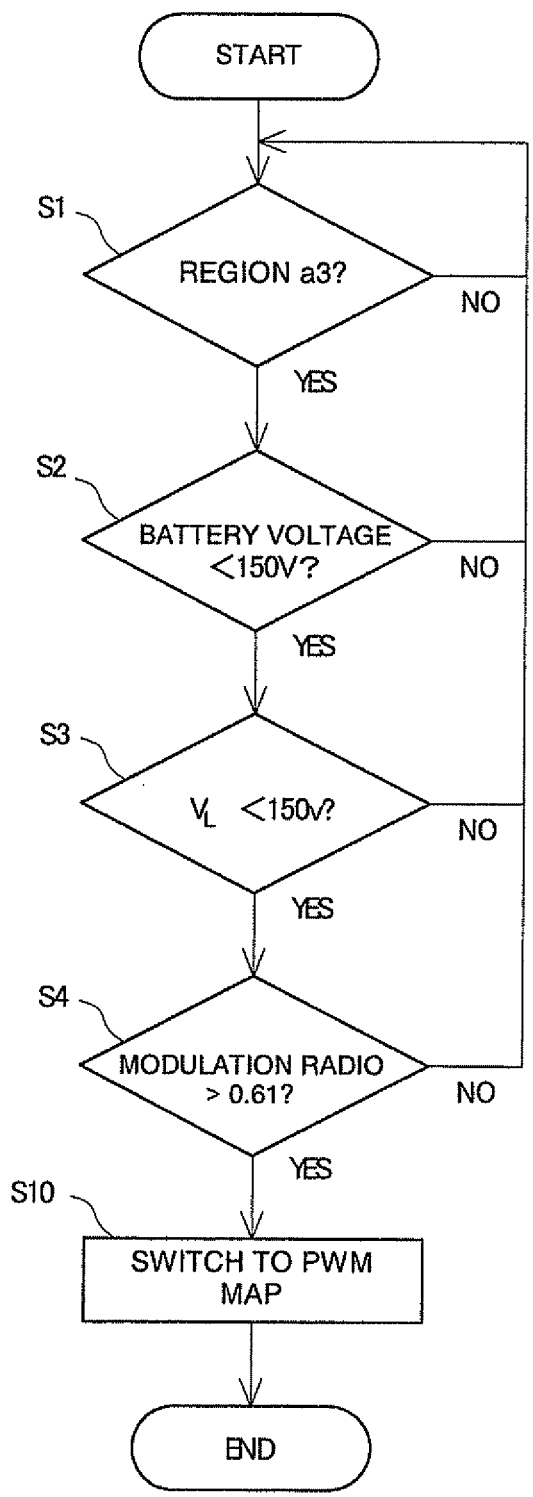
FIG. 9 is a flowchart showing control according to a third embodiment, which is performed in the control mode selection section.

FIG. 9 shows a control flow according to a third embodiment. Steps S1 to S3 in this control flow are the same as those in the control flow according to the second embodiment. When the converter input voltage VL is less than 150 V (YES at step S3), it is determined whether or not the modulation ratio K is greater than 0.61 (step S4). When the modulation ratio K is not greater than 0.61 (NO at step S4), the control based on the fuel efficiency improvement map is continued without switching the map. On the other hand, when the modulation ratio K has become greater than 0.61 (YES at step S9), control for switching the map to be applied from the fuel efficiency improvement map to the PWM control map is performed (step S10).

According to the control flow of the third embodiment, by performing control for switching from the fuel efficiency improvement map to the PWM control map when the battery voltage VB and the converter input voltage have dropped, and when the modulation ratio K is greater than 0.61, the control mode is switched to the sinusoidal wave PWM control based on the PWM control map at a time when a transition from the PWM control to the rectangular wave control will happen soon in a state in which the rectangular wave control region a3 of the fuel efficiency improvement map is extended. Thus, the step-up performed by the converter 12 can be started while the PWM control is continued, and the torque deviation resulting from degradation in the control responsivity can be prevented from occurring.

Figure 10:
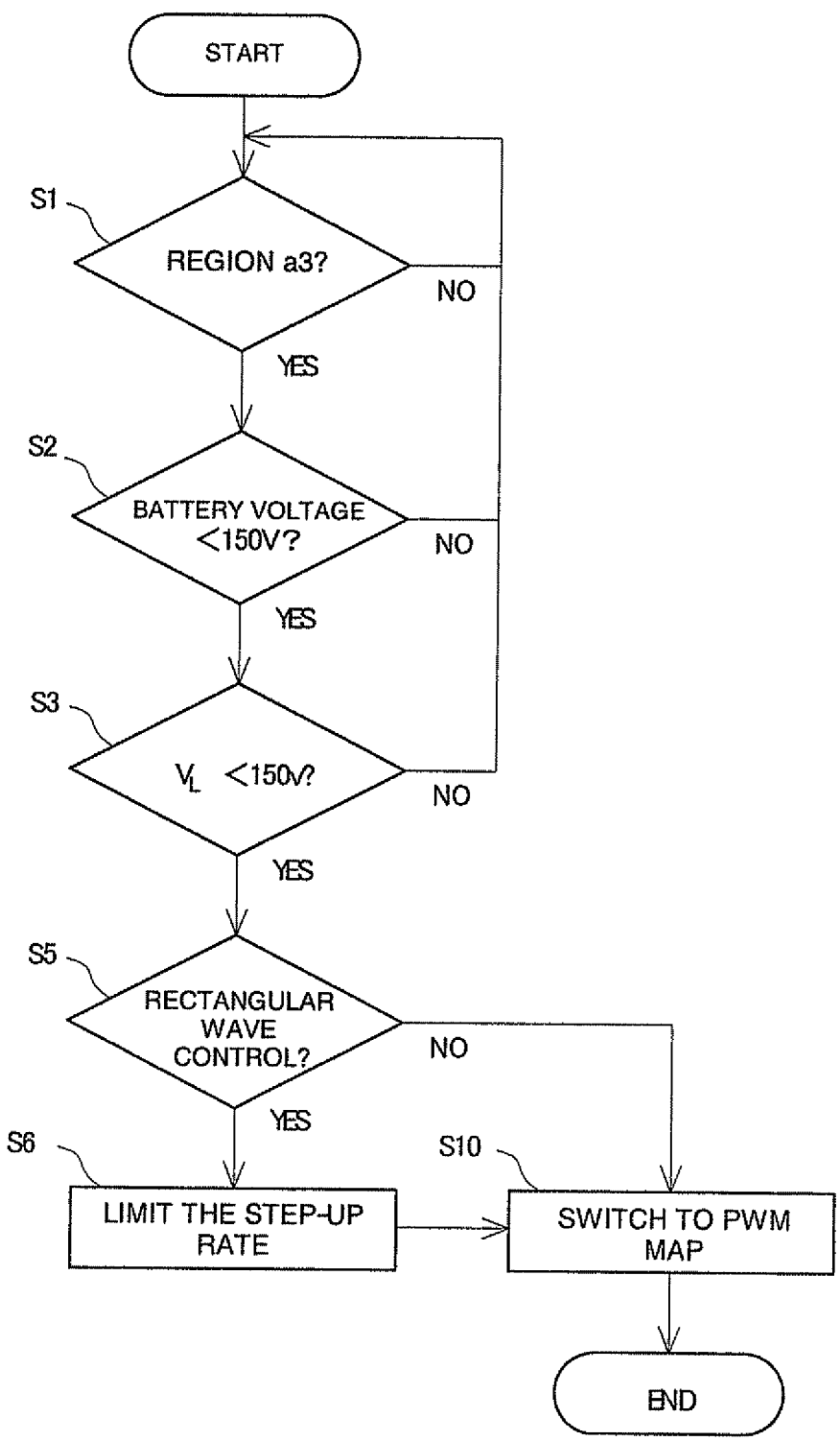
FIG. 10 is a flowchart showing control according to a fourth embodiment, which is performed in the control mode selection section.

FIG. 10 shows a control flow according to a fourth embodiment. Steps S1 to S3 in this control flow are the same as those in the control flow according to the third embodiment. When the converter input voltage VL is less than 150 V (YES at step S3), it is determined whether or not the rectangular wave control is performed for the alternating-current motor M (step S5). When the rectangular wave control is not performed, or, in other words, when either the sinusoidal wave PWM control or the overmodulation PWM control is performed (NO at step S5), control for switching from the fuel efficiency improvement map to the PWM control map is immediately performed (step S10). On the other hand, when the rectangular wave control is performed (YES at step S5), after the step-up rate, or in other words the rate of voltage increase per unit time, for the step-up operation performed by the converter 12 toward the voltage command VH* is limited to be relatively moderate (step S6), control for switching from the fuel efficiency improvement map to the PWM control map is performed (step S10).

According to this control flow of the fourth embodiment, by limiting the step-up rate of the converter 12 before switching from the rectangular wave control based on the fuel efficiency improvement map to the sinusoidal wave PWM control based on the PWM control map, the control mode can be switched smoothly and safely, and control failure can be avoided.

Figure 11:
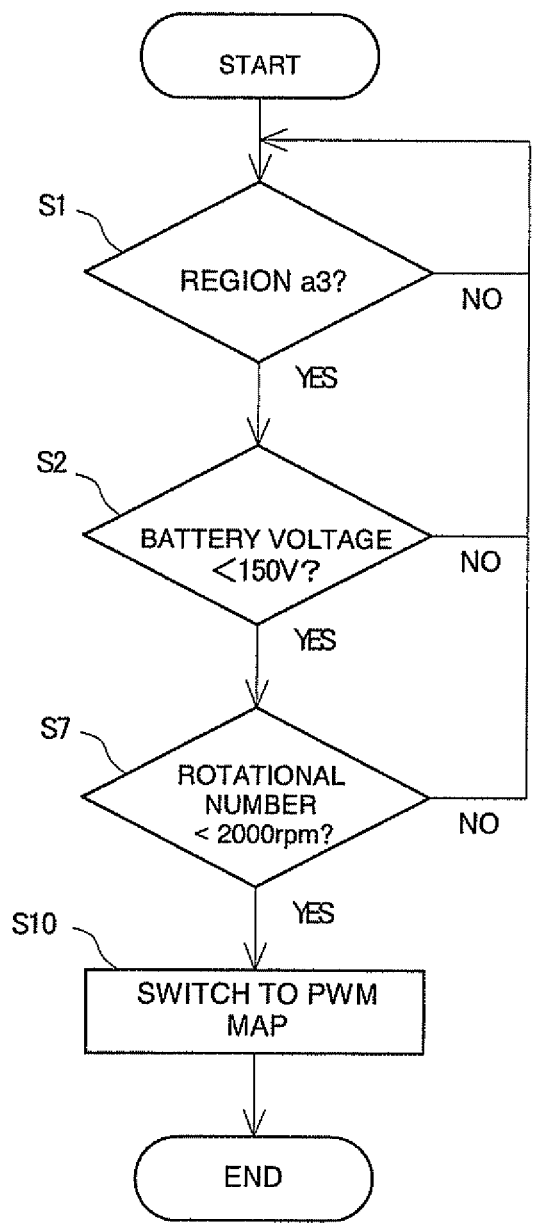
FIG. 11 is a flowchart showing control according to a fifth embodiment, which is performed in the control mode selection section.

FIG. 11 shows a control flow according to a fifth embodiment. Steps S1 and S2 in this control flow are the same as those in the control flow according to the first embodiment. When the battery voltage VS drops below 150 V (YES at step S2), it is determined whether or not the rotational number N of the motor is lower than 2000 rpm (step S7). When the rotational number N is higher than 2000 rpm (NO at step S7), the control based on the fuel efficiency improvement map is continued without switching the map. On the other hand, when the rotational number N is lower than 2000 rpm (YES at step S7), control for switching the map to be applied from the fuel efficiency improvement map to the PWM control map is performed (step S10).

According to this control flow of the fifth embodiment, it is possible to avoid a situation in which the rectangular wave control, which is relatively unstable control, is performed in a low revolution range of the motor.

Figure 12:
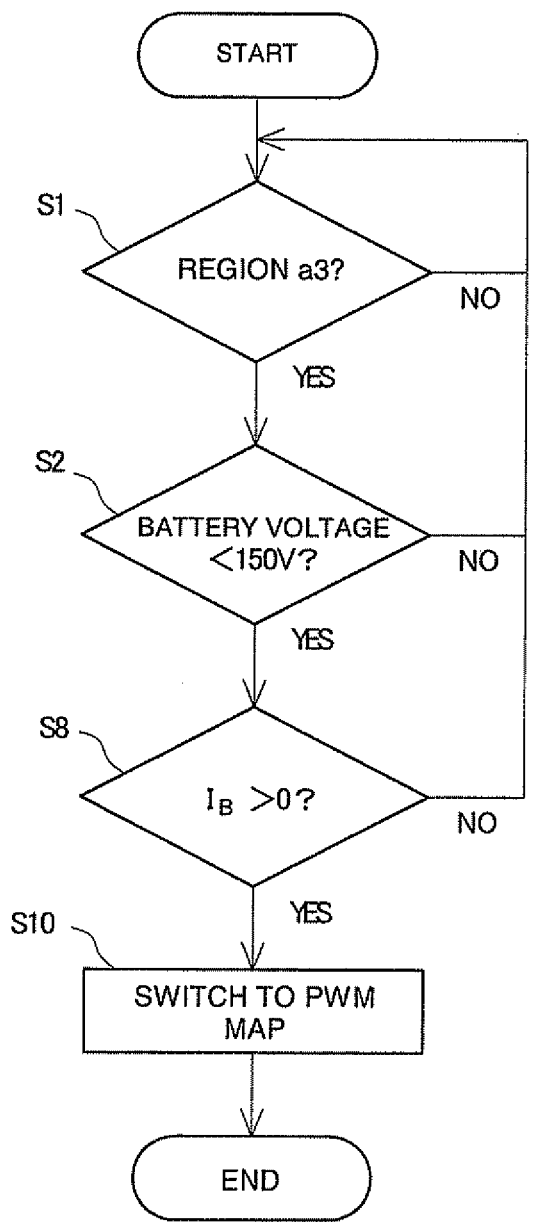
FIG. 12 is a flowchart showing control according to a sixth embodiment, which is performed in the control mode selection section.

FIG. 12 shows a control flow according to a sixth embodiment. Steps S1 and S2 in this control flow are the same as those in the control flow according to the first embodiment. When the battery voltage VB drops below 150 V (YES at step S2), it is determined whether or not the battery current IB detected by the current sensor 23 is positive (step S8). When the battery current IB is not positive, or in other words when the vehicle is not being driven (NO at step S8), the control based on the fuel efficiency improvement map is continued without switching the map. On the other hand, when the battery current IB is positive (YES at step S8), control for switching the map to be applied from the fuel efficiency improvement map to the PWM control map is performed (step S10).

According to this control flow of the sixth embodiment, because there is no concern that the voltage may fall below the lower limit since no current is drawn from the direct-current power supply during regenerative operation, the fuel efficiency can be improved by continuing the rectangular wave control based on the fuel efficiency improvement map without switching the map.

It should be noted that although the above-described motor drive control device 10 is described by way of example as a device which is applied to a vehicle such as an electric vehicle or a hybrid vehicle, the motor drive control device according to the present invention is not limited to the one for a vehicle, but may also be widely applied to any other machines, mechanisms, or devices which use an alternating-current motor to obtain a driving force.

The invention claimed is:
1. A motor drive control device, comprising:
a direct-current power supply;
a voltage transformer section capable of stepping up a direct-current voltage supplied from the direct-current power supply;
an inverter for converting the direct-current voltage supplied from the voltage transformer section to an alternating-current voltage for driving an alternating-current motor; and a control section for outputting control signals to the voltage transformer section and the inverter, wherein:

the control section has a first map and a second map regarding control of the alternating-current motor, the first map and the second map having an identical relationship between a rotational number of the motor and a motor maximum output torque, wherein the first map is a map in which a step-up starting point of the converter is set in a higher revolution range than that in the second map, and which thus includes a relatively large rectangular wave control region, and the second map is a map for mainly performing pulse width modulation control, and the control section further includes a map switching section for switching from control based on the first map to control based on the second map in accordance with conditions of the direct-current power supply.

2. The motor drive control device according to claim 1, wherein:

an entire region in which pulse width modulation control is possible, ranging from an output voltage of the direct-current power supply to a step-up upper limit voltage of the converter, is set to be a pulse width modulation control region in the second map, whereas the first map includes a rectangular wave control region to perform rectangular wave control and a pulse width modulation control region to perform pulse width modulation control, in which the output voltage of the direct-current power supply is used without being stepped up by the converter.

3. The motor drive control device according to claim 1, wherein the map switching section performs control for switching from the first map to the second map when the output voltage of the direct-current power supply is lower than a predetermined value.

4. The motor drive control device according to claim 1, wherein the map switching section performs control for switching from the first map to the second map when the output voltage of the direct-current power supply is lower than a predetermined value, and when a converter input voltage is lower than a predetermined value.

5. The motor drive control device according to claim 1, wherein the map switching section performs control for switching from the first map to the second map when the output voltage of the direct-current power supply is lower than a predetermined value, and when a modulation ratio, which is a ratio of an amplitude value of a motor input voltage with respect to an output voltage value of the voltage transformer section, is greater than a predetermined value.

6. The motor drive control device according to claim 1, wherein the map switching section limits a step-up rate of the voltage transformer section before switching from the first map to the second map when the output voltage of the direct-current power supply is lower than a predetermined value, and when the rectangular wave control based on the first map is being performed.

7. The motor drive control device according to claim 1, wherein the map switching section performs control for switching from the first map to the second map when the output voltage of the direct-current power supply is lower than a predetermined value, and when the rotational number of the motor is lower than a predetermined value.

8. The motor drive control device according to claim 1, wherein the control section further includes a determination part for determining whether the motor is being driven or is in regenerative operation, and the map switching section does not switch from the first map to the second map when the motor is in regenerative operation.

* * * * *